United States Patent
Diaz, Jr.

(10) Patent No.: US 9,983,252 B2
(45) Date of Patent: May 29, 2018

(54) SYSTEMS AND METHODS FOR TESTING RESISTANCE BASED ON CUSTOMER SPECIFIC WIRES

(71) Applicant: Fast Heat, Inc., Elmhurst, IL (US)

(72) Inventor: Manuel Luna Diaz, Jr., Burbank, IL (US)

(73) Assignee: Fast Heat, Inc., Elmhurst, IL (US)

( * ) Notice: Subject to any disclaimer, the term of this patent is extended or adjusted under 35 U.S.C. 154(b) by 0 days. days.

(21) Appl. No.: 15/076,283

(22) Filed: Mar. 21, 2016

(65) Prior Publication Data

US 2017/0045569 A1 Feb. 16, 2017

Related U.S. Application Data

(60) Provisional application No. 62/136,244, filed on Mar. 20, 2015.

(51) Int. Cl.
G08B 29/00 (2006.01)
G01R 31/02 (2006.01)
G08B 5/36 (2006.01)

(52) U.S. Cl.
CPC ......... *G01R 31/026* (2013.01); *G01R 31/021* (2013.01); *G08B 5/36* (2013.01)

(58) Field of Classification Search
CPC ............................. G01R 31/026; G08B 5/36
USPC .................................. 340/506, 521, 3.1, 514
See application file for complete search history.

(56) References Cited

U.S. PATENT DOCUMENTS

2001/0045833 A1* 11/2001 Tury ...................... H05B 37/03
324/508
2010/0074415 A1* 3/2010 Knudson ............... H04M 3/308
379/21

* cited by examiner

*Primary Examiner* — Daryl Pope
(74) *Attorney, Agent, or Firm* — Polsinelli PC

(57) ABSTRACT

Aspects of the present disclosure involve a testing device/apparatus configured to test various issues caused by or otherwise associated with pinched wires when two halves of a hot half tool are assembled.

8 Claims, 4 Drawing Sheets

SYSTEMS AND METHODS FOR TESTING RESISTANCE BASED ON CUSTOMER SPECIFIC WIRES

CROSS REFERENCE TO RELATED APPLICATIONS

The present non-provisional application claims priority to U.S. Provisional Application No. 62/136,244 entitled "CABLEXCHECKER," filed on Mar. 20, 2015, and which is hereby incorporated by reference in its entirety.

FIELD OF THE INVENTION

Aspects of the present disclosure relate to an apparatus, system, and/or device for checking levels of resistance of a circuit.

BACKGROUND

A continuity checker represents a type of electrical test equipment that is often used to determine whether an electrical path can be established between two points of an electrical system and whether any continuity issue exist with respect to the path. Point-To-Point ("PTP") represents a methodology commonly used to depict the physical wiring of a given electrical system, or apparatus. For example, a PTP diagram typically illustrates how electrical devices are physically connected via cables and wires. It is with these aspects in mind that aspects of the present disclosure were conceived.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

DETAILED DESCRIPTION

Aspects of the present disclosure involve a testing device or apparatus configured to test various issues caused by or otherwise associated with pinched wires when two halves of a hot half tool are assembled. In various aspects, the testing device and/or apparatus may test for Ohms Resistance, heater resistance, opens circuit, shorts to ground (e.g., direct), etc., all of which may be performed to identify and/or quantify continuity issues. In other embodiments, the testing device/apparatus may test for Ohms resistance and open circuits on thermocouples and/or heating elements.

According to one embodiment, the testing device or apparatus may include a series of connectors implemented or otherwise designed according to a user-specified wiring diagram, such as a PTP wiring diagram. Generally speaking, PTP represents a methodology commonly used to depict the physical wiring of a given electrical system, or apparatus. For example, a PTP diagram will often illustrate how a given device is physically connected to wires, namely the actual PTP wiring connections, system component interconnections, used and unused terminal designations and terminal boards, wire run layouts, and/or the like. Instead of building out cables for testing, the testing devices and/or apparatuses described herein are implemented based on a customer's existing connectors and/or cables, as described in a PTP wiring diagram. Although the various examples described herein refer to PTP wiring diagrams, it is contemplated that any type of wiring diagram may be used. And in some embodiments, as will further be described below, a customer may only provide zone names for a particular connector and not a complete wiring diagram.

Figure 1A:
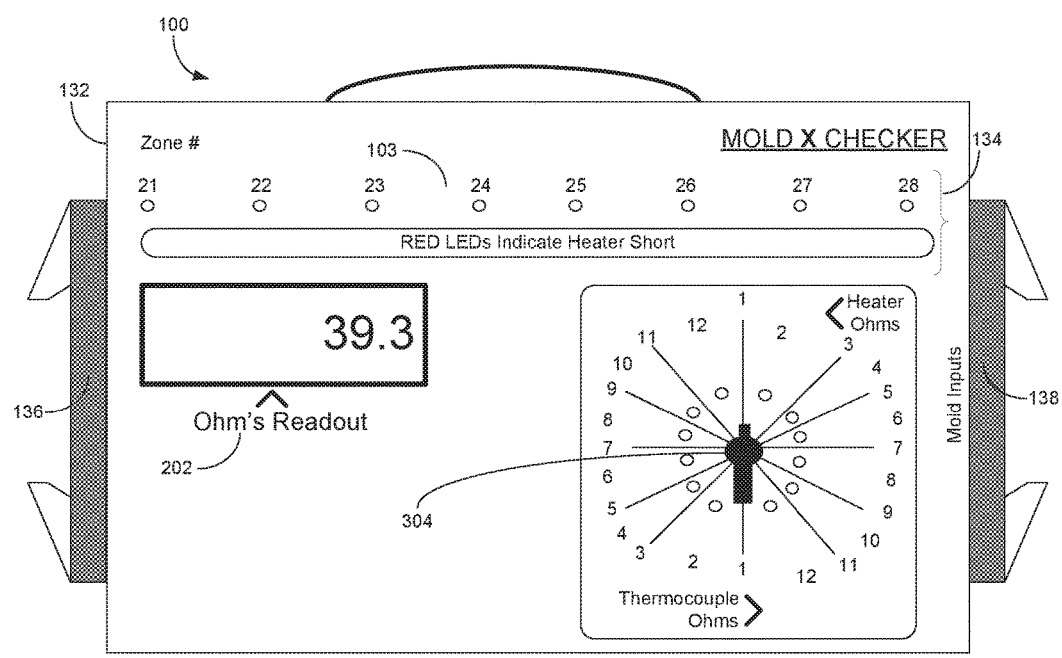
FIG. 1A is a block diagram of a testing apparatus, according to one embodiment of the present disclosure.

FIG. 1A provides an illustration of a testing fixture and/or apparatus 100 that may be used to test for Ohms Resistance, heater resistance, opens circuit, shorts to ground (e.g., direct), according to one embodiment. As illustrated, the testing fixture and/or apparatus includes a housing/casing 132 having the external appearance of a square and/or rectangular box. Cable connector ends 136 and 138 allow customer cables for test to be connected or otherwise plugged into the housing/casing 132 of the testing fixture and/or apparatus 100 and thereby enable the testing of a thermocouple sensor and/or heating unit to determine resistance, heat resistance, shorts, and/or the like. Generally speaking, a thermocouple is a type of sensor used to measure temperature. Typically, thermocouple consist of two wire legs, connected together at one end, creating a junction, wherein the junction enables temperature to be measured. When the junction experiences a change in temperature, a voltage is created. Heating elements convert electricity into heat through the process of resistive or Joule heating. Electric current passing through the element encounters resistance, resulting in heating of the element.

The testing fixture and/or apparatus 100 further includes a top portion or lid 103 that is operatively connected to the housing/casing 132 and which displays a series of visual indicators (collectively referenced as 134) that protrude from the lid 103 of the housing/casing 132. For example, in one embodiment, the visual indicators may be one more light emitting diodes (LEDs) mounted within the housing/casing 132 that are operatively interconnected within the circuitry of the housing/casing 132, as will be further described in detail below. The visual indicators 134 provide a visual indication of the continuity of the mold heaters being tested. For example and as will be further described in detail below, depending on which visual indicator 134 is illuminated, it can be determined whether the mold heater is functioning properly, resistance levels, and/or the like. In some embodiments, the testing fixture and/or apparatus 100 may further include a dial 304 that may be manipulated by an operator to identify a specific zone of the customer cable for testing. Stated differently, manipulation of the dial 304 may cause the testing fixture and/or apparatus 100 to automatically test the customer cable connected to the testing fixture and/or apparatus 100 within an applicable zone.

Figure 1B:
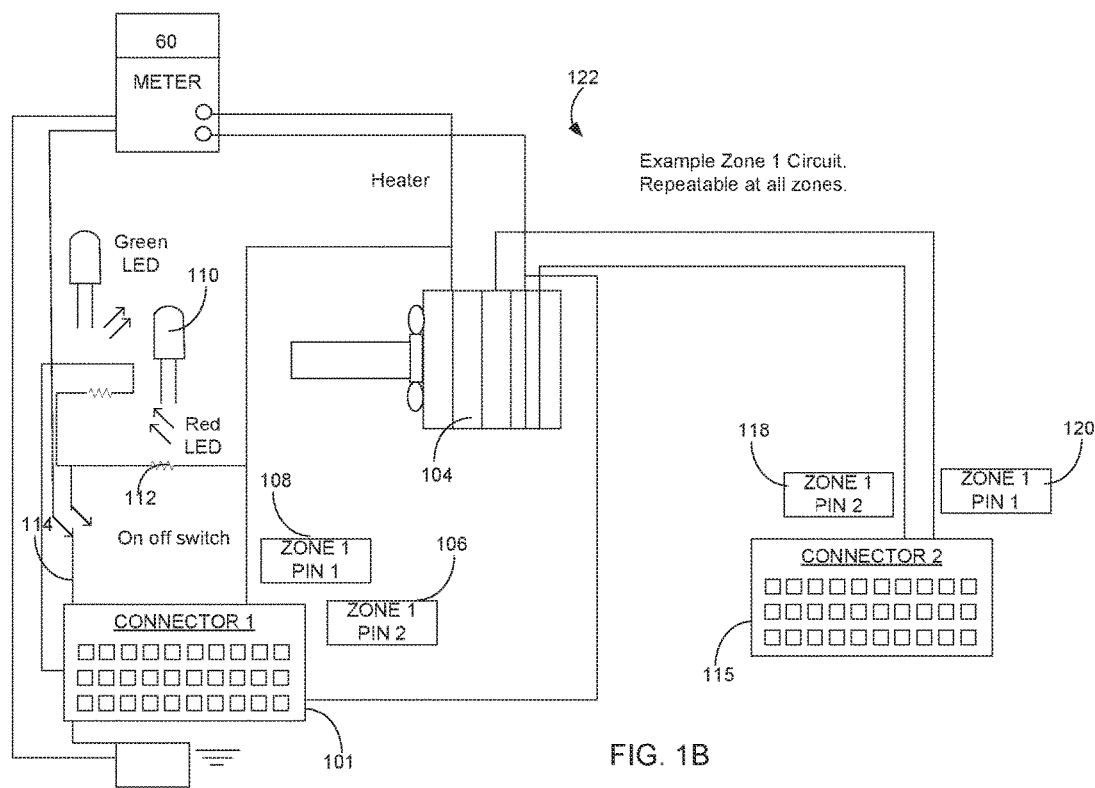
FIG. 1B is a block diagram of a testing apparatus circuitry, according to one embodiment of the present disclosure.

FIG. 1B provides an illustration of a schematic of circuitry 122 that may be included or otherwise implemented within the testing fixture and/or apparatus 100 illustrated in FIG. 1A. In the illustrated embodiment, the testing apparatus 100 includes a first connector 101 that may be implemented according to a user-specified wiring diagram. Thus, in one embodiment, the various connectors of the testing device and/or apparatus 100 may be designed according to the user-specified wiring diagram.

Referring again to FIG. 1B, the first connector 101 includes a first connector pin including a wire that is placed in or otherwise included in a Zone 1+ Pin 1 (illustrated at 108). The Zone 1+ Pin 1 may be operatively attached and/or otherwise connected (e.g., soldered) to a 24 position rotary switch 104. More specifically and in one embodiment, the wire in or otherwise associated with Zone 1+ Pin 1 may be connected (e.g., soldered) to position 1 on a first throw of the 24 position rotary switch 104. In another embodiment, a wire may also be connected or otherwise placed in Zone 1, Pin 2 106 and the wire may be connected (e.g., soldered) to position 1 on a second throw of the 24 position rotary switch 104. Additionally, a second wire may be plated in position on the first connecter 101 at Zone 1, Pin 2 106 and the second wire may be operatively attached and/or otherwise connected (e.g., soldered) to a light emitting diode ("LED") (e.g., a red colored LED) 110 on the cathode side. In such an embodiment, the anode side of the LED 110 may be operatively connected (e.g., soldered) to another, different wire that is connected or otherwise attached to some form of a resister 112 (e.g. a 1k ohm resister) and a battery or power source 114 (e.g., a 9 volt battery), thereby completing the circuit for the first connector 101.

The resistor 112 may be wired to the power source 114 in a second circuit position and then wired to the power source 114 at the positive side, or some other additional power source similar to the power source 114. In one embodiment, the negative side of the power source 114 may be connected to a ground connection at the first connector 101, thereby completing the circuit from the Heater connector 1 to the 24 position rotary switch. Similar connection processes are completed for each respective Zone.

Referring generally again to FIG. 1B the testing apparatus 100 may include a second connector 115 that operates similar to connector 101. A wire is connected or otherwise placed at the Zone 1, Pin 1 of the second connector 115 (illustrated at 120). The wire of Zone 1 + Pin 1 may be operatively attached and/or otherwise connected (e.g., soldered) to position 13 (or other position) on the first throw of the 24 position rotary switch 104. A wire is also placed in Zone 1 + Pin 2 at 118 and connected (e.g., directly soldered) to position 13 on the second throw of the 24 position rotary switch 104, thereby completing the circuit from the Heater connector 1 to the 24 position rotary switch. Similar connection processes are completed for each respective Zone.

The testing apparatus 100 may establish a PTP connection that generates a "power on" light indicating that the testing apparatus and/or device 100 is functioning properly. In one embodiment, a green LED may be used to indicate that the power light is on and thereby indicating that the power light is functioning properly. A red wire may be operatively attached and/or otherwise (e.g., soldered) to the green LEDs anode side. The red wire is communicatively connected (e.g., soldered) to a 1K Ohm resistor, which is communicatively connected to the power switch in the second circuit, position, and then wired to the power source 114 at the positive side. A black wire is soldered to the cathode side of the green LED. The black wire is then wired to the power source 114 at the negative side. A resistance meter 60 may be powered an independent power source that is attached to a double pole single throw switch using one of the switch circuits.

Figure 2:
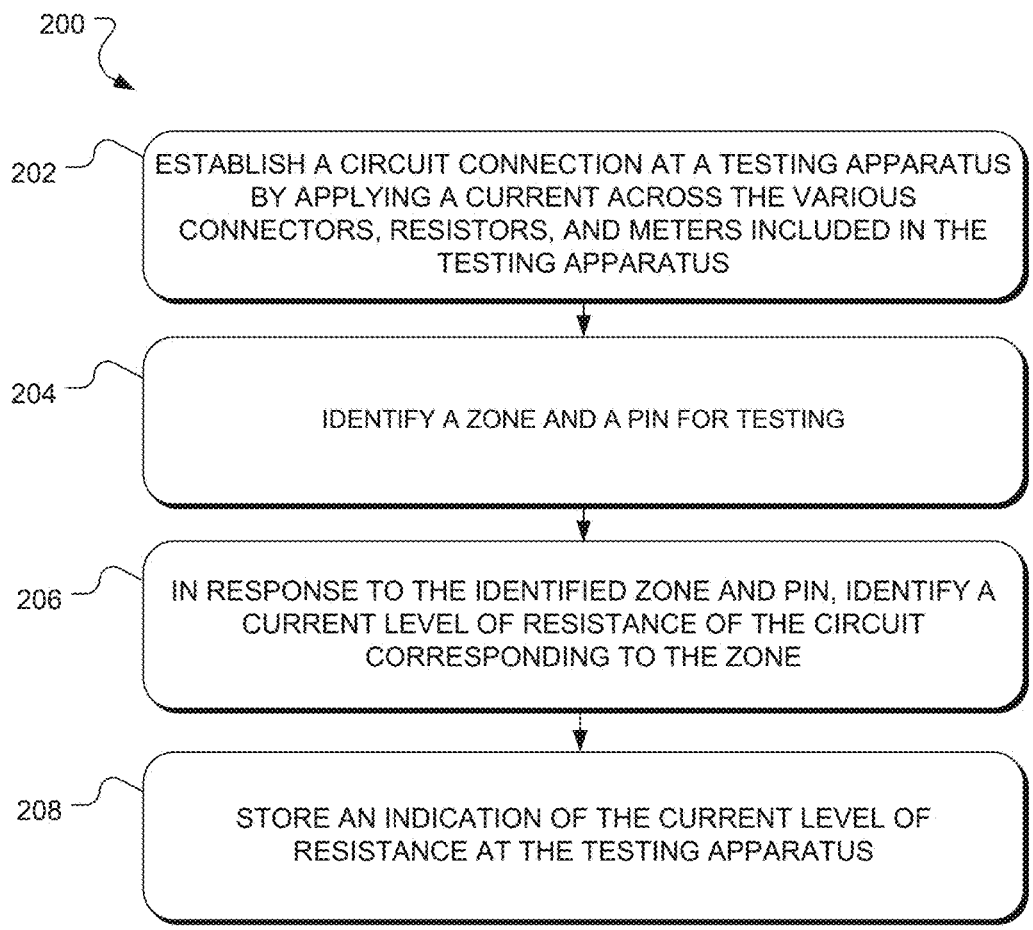
FIG. 2 provides an example illustration of a process for testing a cable, according to one embodiment of the present disclosure.
Figure 3:
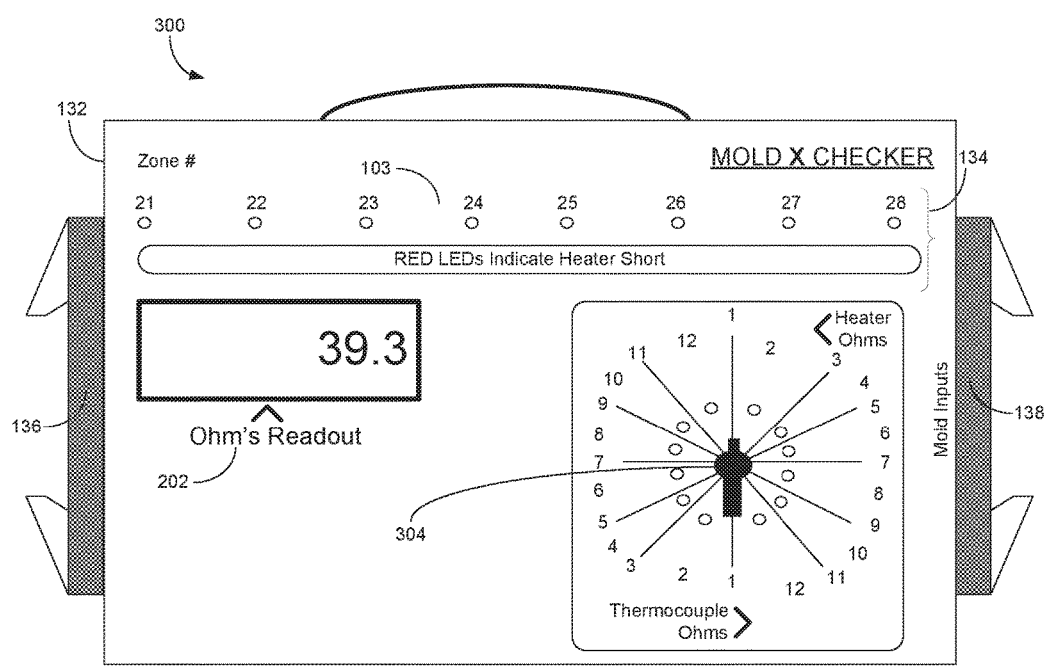
FIG. 3 provides and illustration of another testing apparatus, according to one embodiment of the present disclosure.

FIG. 2 provides an illustration of a process 200 for employing a testing apparatus (e.g., the testing apparatus 100) to for various types of resistance, such as Ohms resistance, heater resistance, among others. As illustrated, at 202 process 200 begins with establishing a circuit connection within a testing apparatus capable of testing the resistance of the circuit. For example, a current may be applied across the testing apparatus of FIG. 1, via the various wires, connectors, and resistors. At 204, user-input is provided to the testing apparatus to indicate which zone (e.g., Zone 1 or Zone 2) is currently being tested by the testing apparatus. FIG. 3 provides an illustration of a user providing input to the testing apparatus (e.g., the test apparatus 100), according to one embodiment. In the illustrated embodiment, the rotary switch 304 of the testing apparatus 300 is manipulated to identify Zone 1. Thus, the rotary switch 304 may be used to identify each zone and pin location. The Ohms resistance corresponding to the identified zone may be displayed at 202 and a visualization as to the whether the Zone 1 is showing or otherwise causing a heater shortage may be provided at 308.

Referring again to FIG. 2, at 206, in response to the identified zone, output from a resistance meter is analyzed to determine whether any continuity issues of the circuit connection exist, particularly with respect to resistance. For example, and in one embodiment, the resistance meter may indicate the current level of resistance of the circuit, the corresponding heaters, heating elements, thermocouples, and/or the like, all of which are enabled based on the customer's specific wiring of the cable. Doing so enables customers to test wires without using multimeter test leads, which may be labor intensive and expensive. An indication of the resistance is stored at 208, within the testing apparatus 100.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided, in part, as a computer program product, or software, that may include a machine-readable medium having stored thereon instructions, which may be used to program portions of the testing apparatus 100, other computer system, or other electronic devices, to perform the various processes described in the present disclosure. A machine-readable medium includes any mechanism for storing information in a form (e.g., software, processing application) readable by a machine (e.g., a computer). The machine-readable medium may include, but is not limited to, magnetic storage medium, optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages.

The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

Those skilled in the art will appreciate that variations from the specific embodiments disclosed above are contemplated by the invention. The following invention should not be restricted to the above embodiments, but should be measured by the following claims.

What is claimed is:

1. A testing apparatus for testing a cable comprising:
   a dial operatively connected to a housing containing:
      a first electrical connector for determining resistance at a cable coupled to a heat sensor, wherein the first electrical connector is:
         wired to a first wire of the cable coupled to the heat sensor; and
         operatively connected to a first visual indicator connected to at least one first resistor and a power source;
      a second electrical connector, wherein the second electrical connector is:
         wired to a second wire of the cable coupled to the heat sensor; and
         operatively connected to a second visual indicator connected to at least one second resistor and the power source; and
      wherein, in response to manipulating the dial to identifying a first zone corresponding to the first wire and the first visual indicator, the first electrical connector is configured to illuminate the first visual indicator indicating that a resistance of the first wire is being determined; and
      wherein, in response to manipulating the dial to identifying a second zone corresponding to the second wire and the second visual indicator, the first electrical connector is configured to illuminate a second visual indicator indicating that a resistance of the second wire is being determined.

2. The apparatus of claim 1, wherein the first electrical connector and the second electrical connector are implemented according to a wiring diagram provided by a customer.

3. The apparatus of claim 1, wherein the first visual indicator and the second visual indicator are light emitting diodes.

4. The apparatus of claim 1, wherein the housing is in the form of a box having a lid, wherein the first and second visual indicators are located protruding through a front surface of the lid.

5. A method for testing a cable comprising:
   manipulating a dial to identify a first zone corresponding to a first electrical connector for determining resistance at a cable coupled to a heat sensor, wherein the first electrical connector is:
      wired to a first wire of the cable coupled to the heat sensor; and
      operatively connected to a first visual indicator connected to at least one first resistor and a power source;
   manipulating the dial to identify a second zone corresponding to a second electrical connector, wherein the second electrical connector is:
      wired to a second wire of the cable coupled to the heat sensor; and
      operatively connected to a second visual indicator connected to at least one first resistor and a power source;
   in response to manipulating the dial to identify the first zone corresponding to the first wire and the first visual indicator, illuminate the first visual indicator indicating that a resistance of the first wire is being determined; and
   in response to manipulating the dial to identify the second zone corresponding to the second wire and the second visual indicator, illuminate the second visual indicator indicating that a resistance of the first wire is being determined.

6. The method of claim 5, wherein the first electrical connector and the second electrical connector are implemented according to a wiring diagram provided by a customer.

7. The method of claim 5, wherein the first visual indicator and the second visual indicator are light emitting diodes.

8. The method of claim 5, wherein the housing is in the form of a box having a lid, wherein the first and second visual indicators are located protruding through a front surface of the lid.

* * * * *